United States Patent
Braun (10) Patent No.: US 10,153,772 B2
(45) Date of Patent: Dec. 11, 2018

(54) SUPERCONDUCTING DEVICES WITH ENFORCED DIRECTIONALITY

(71) Applicant: Microsoft Technology Licensing, LLC, Redmond, WA (US)

(72) Inventor: Alexander L Braun, Baltimore, MD (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/425,989

(22) Filed: Feb. 6, 2017

(65) Prior Publication Data

US 2018/0226975 A1 Aug. 9, 2018

(51) Int. Cl.
*H03K 19/195* (2006.01)
*H01L 39/02* (2006.01)
*H03K 19/21* (2006.01)

(52) U.S. Cl.
CPC ......... *H03K 19/195* (2013.01); *H01L 39/025* (2013.01); *H03K 19/21* (2013.01)

(58) Field of Classification Search
CPC ..... H03K 19/195; H03K 19/21; H01L 39/025
USPC .............................................. 326/3; 327/367
See application file for complete search history.

(56) References Cited

U.S. PATENT DOCUMENTS

| | | | |
|---|---|---|---|
| 5,327,130 A * | 7/1994 | Kang | G01R 13/34 324/127 |
| 6,507,234 B1 | 1/2003 | Johnson et al. | |
| 6,549,059 B1 | 4/2003 | Johnson | |
| 7,129,870 B2 * | 10/2006 | Hirano | H03K 3/38 341/133 |
| 7,724,083 B2 | 5/2010 | Herring et al. | |
| 7,786,748 B1 | 8/2010 | Herr | |
| 7,868,645 B2 | 1/2011 | Herr et al. | |
| 8,138,784 B2 | 3/2012 | Przybysz et al. | |

(Continued)

FOREIGN PATENT DOCUMENTS

| | | |
|---|---|---|
| EP | 1432169 A1 | 6/2004 |
| WO | 2016138406 A1 | 9/2016 |

OTHER PUBLICATIONS

Ortlepp, et al., "Flip-Flopping Fractional Flux Quanta", In Journal of Science, vol. 312, Issue 5779, Apr. 20, 2006, pp. 1-14.

(Continued)

*Primary Examiner* — Daniel D Chang
(74) *Attorney, Agent, or Firm* — Ranjeev Singh; Singh Law, PLLC (57) ABSTRACT

Superconducting devices with enforced directionality and related methods are provided. In one example, a device including a first Josephson junction transmission line (JTL) for propagating a first set of quantum signals in a first direction and a second JTL for propagating a second set of quantum signals in the first direction is provided. The device may include a logic gate having a first input terminal for receiving the first set of quantum signals via the first JTL, and a second input terminal. The device may include a unidirectional buffer having a first input terminal for receiving the second set of quantum signals via the second JTL and an output terminal for coupling the second set of quantum signals to the second input terminal of the logic gate, where the unidirectional buffer may be configured to propagate quantum signals in only the first direction.

18 Claims, 4 Drawing Sheets

(56) References Cited

U.S. PATENT DOCUMENTS

| | | |
|---|---|---|
| 8,489,163 B2 | 7/2013 | Herr et al. |
| 9,292,642 B2 | 3/2016 | Herr et al. |
| 9,455,707 B2 | 9/2016 | Herr et al. |
| 9,473,124 B1 | 10/2016 | Mukhanov et al. |
| 2003/0016069 A1 | 1/2003 | Furuta et al. |
| 2003/0039138 A1 | 2/2003 | Herr |
| 2003/0076251 A1 | 4/2003 | Gupta et al. |
| 2007/0052441 A1* | 3/2007 | Taguchi ............... H03K 3/38 326/3 |
| 2007/0158791 A1* | 7/2007 | Wakana ............... H01L 27/18 257/659 |

OTHER PUBLICATIONS

Friedman, Eby G., "High Performance Clock Distribution Networks", In Publication of Springer US, Oct. 28, 2016, 1 page.

Dimov, et al., "The Josephson Transmission Line as an Impedance Matchng Circuit", In Journal of WSEAS Transactions on Circuits and Systems, vol. 3, Issue 5, Jul. 2004, 6 pages.

"International Search Report and Written Opinion Issued in PCT Application No. PCT/US2018/015827", dated May 8, 2018, 16 Pages.

\* cited by examiner

SUPERCONDUCTING DEVICES WITH ENFORCED DIRECTIONALITY

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power they still consume power because of the need to maintain the state of CMOS transistors. In addition, because CMOS circuits are powered using DC voltage there is a certain amount of current leakage even when the CMOS circuits are inactive. Thus, even when such circuits are not processing information certain amount of power is wasted not only as a result of the requirement to maintain the state of the CMOS transistors, but also as a result of the current leakage.

An alternative approach to the use of processors and related components based on CMOS technology is the use of superconducting logic based devices.

SUMMARY

In one example, the present disclosure relates to a device including a first Josephson junction transmission line (JTL) for propagating a first set of quantum signals in a first direction and a second Josephson junction transmission line (JTL) for propagating a second set of quantum signals in the first direction. The device may further include a logic gate comprising a plurality of Josephson junctions, where the logic gate has a first input terminal for receiving the first set of quantum signals via the first JTL, and a second input terminal. The device may further include at least one unidirectional buffer having a first input terminal for receiving the second set of quantum signals via the second JTL and an output terminal for coupling the second set of quantum signals to the second input terminal of the at least one logic gate, where the unidirectional buffer may be configured to propagate quantum signals in only the first direction.

In another aspect, the present disclosure relates to a unidirectional buffer including an input terminal for receiving quantum signals via a Josephson transmission line (JTL) configured to propagate signals in a first direction, where the unidirectional buffer is configured to propagate quantum signals in only the first direction and not in a second direction opposite to the first direction.

In another aspect, the present disclosure relates to a device including a logic gate comprising a plurality of Josephson junctions, where the logic gate has a first input terminal for receiving quantum signals and a second input terminal for receiving quantum signals. The device may further include a first unidirectional buffer having a first input terminal for receiving the quantum signals and an output terminal for coupling the quantum signals to the first input terminal of the at least one logic gate, where the unidirectional buffer is configured to propagate quantum signals in only the first direction. The device may further include a second unidirectional buffer having a first input terminal for receiving the quantum signals and an output terminal for coupling the quantum signals to the first input terminal of the at least one logic gate, where the unidirectional buffer is configured to propagate quantum signals in only the first direction.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Examples described in this disclosure relate to enforced directionality in superconducting logic devices. Certain examples described in this disclosure relate to unidirectional phase mode buffers for use with superconducting logic devices. Unidirectional phase mode buffers may be used in superconducting logic based devices including components such as flip-flops, registers, counters, and other processing components. These superconducting devices may also use phase-mode logic (PML) based devices. In the PML based devices, a logical '1' may be encoded as a phase high and a logical '0' may be encoded as a phase low. The transitions between phase high and phase low may be event-triggered by single flux quantum (SFQ) pulses as described later. Such PML based devices may include PML circuits that may act as low-power superconductor logic circuits. Unlike CMOS transistors, the PML circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the PML circuits. As an example, superconductors are materials that can carry a direct electrical current (DC) in the absence of an electric field. Such materials have almost zero resistance. One such superconductor is Niobium, which has a critical temperature (Tc) of 9.3 Kelvin. At temperatures below Tc, Niobium is superconductive; however, at temperatures above Tc, it behaves as a normal metal with electrical resistance. Thus, in the SIS type of Josephson junctions, superconductors may be Niobium superconductors and insulators may be $Al_2O_3$ barriers. In SIS type of junctions, when a wave function tunnels through the barrier, a changing phase difference in time in the two superconductors creates a potential difference between the two superconductors. In PML circuits, in one example, the SIS type of junction may be part of a superconducting loop. When the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In PML circuits, each Josephson junction may be part of one or more superconducting loops. The phase difference across the junction may be modulated by the magnetic flux applied to the loop.

Various PML circuits including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The PML circuits may advantageously have zero static power dissipation because of the absence of bias resistors. In addition, at least some of the components of the PML circuits may be powered using alternating current (AC) power thereby eliminating the ground return current.

The building blocks of exemplary PML circuits may include various types of logic gates. Exemplary logic gates include an AND gate, an OR gate, a logical A-and-not-B gate and a logical AND & OR (AND/OR) gate. The A-and-not-B gate may have two inputs and one output (Q). An input pulse A may propagate to output Q unless an input pulse B comes first. The AND/OR gate may have two inputs and two outputs (Q1 and Q2). One output (e.g., Q1) may provide a logical OR output and the other output (e.g., Q2) may provide a logical AND output.

PML circuits may use reciprocal quantum logic (RQL) based components, including Josephson transmission lines (JTLs). In PML based devices, JTLs are used for phase alignment, which may occur when two logic cones of different depths converge and the phase depth of each is unequal. PML based devices operate by relying upon multi-phase clock signals, for example a four phase clock signal. Phase mode logic may advantageously help reduce the number of JTLs in RQL circuits needed as delay elements. In RQL circuits based on Wave Pipeline Logic (WPL), signals are only asserted for one half of a clock cycle due to the return to zero data encoding. As a result, when two signals converge at a logic gate they must arrive nearly simultaneously (e.g., within the same AC clock phase of the same AC clock cycle). This often requires inserting significant numbers of JTLs as delay elements to delay an early arriving input to match a later arriving input. The different data encoding in PML may relax these restrictions. As an example, input signals corresponding to the two inputs of a gate may be required to arrive on the same AC clock phase, but may not be required to arrive during the same AC clock cycle. Standard RQL JTLs do not support phase advances of larger than 90 degrees. Thus, in a four phase system up to three JTLs may be used every time logic cones converge, which in this example occurs at the inputs of every multi-input logic gate. The unidirectional phase mode buffer may advantageously remove the need for such JTLs by reducing the maximum number of JTLs required in such circuits from three to one.

Figure 1:
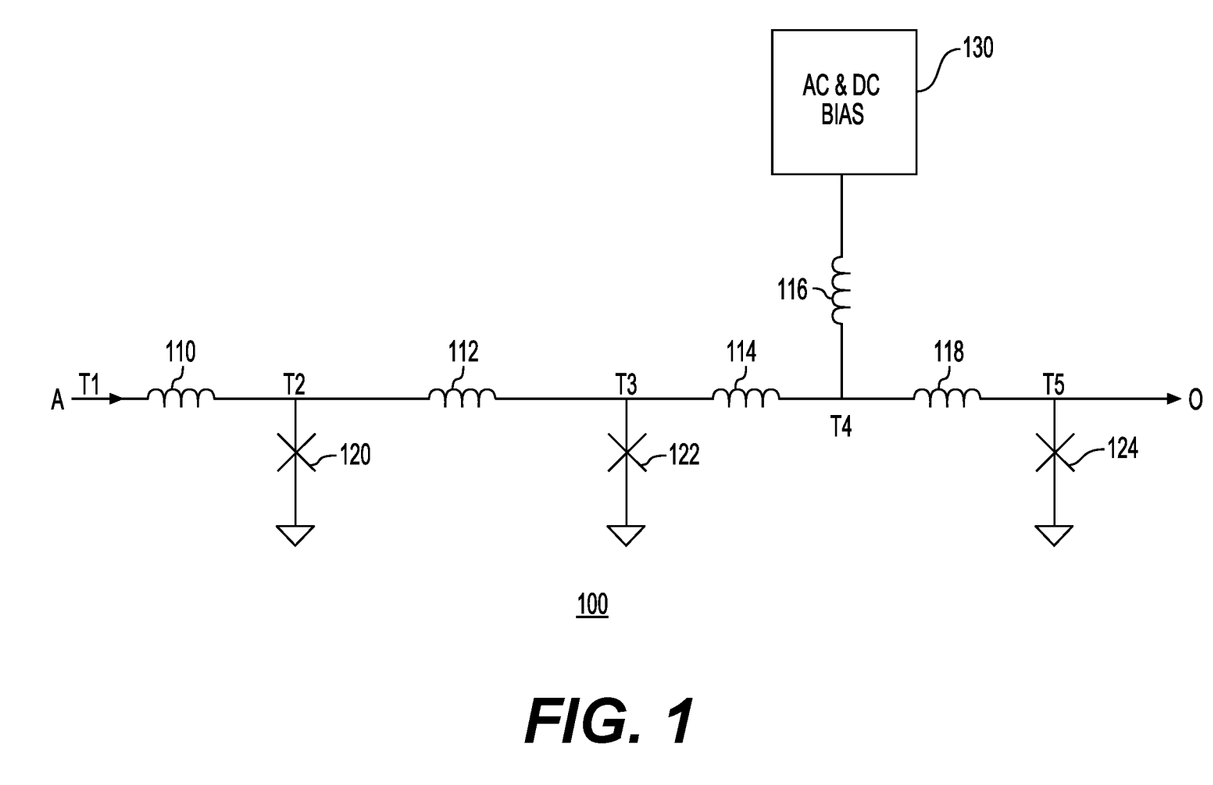
FIG. 1 shows a diagram of a unidirectional phase mode buffer in accordance with one example.

FIG. 1 shows an example of a unidirectional phase mode buffer (UPMB) 100 in accordance with one example. In this example, UPMB 100 may include an input port A and an output port O. UPMB may further include inductors 110, 112, 114, 116, and 118 as arranged in FIG. 1. UPMB 100 may further include Josephson junctions (JJs) 120, 122, and 124 as arranged in FIG. 1. Thus, in this example, inductor 110 may be coupled between terminal T1 and terminal T2. JJ 120 may be coupled between terminal T1 and ground or virtual ground. Inductor 112 may be coupled between terminal T2 and terminal T3. JJ 122 may be coupled between terminal T3 and ground. Inductor 114 may be coupled between terminal T3 and terminal T4. Inductor 116 may be coupled between terminal T4 and a terminal for receiving AC and/or DC bias. Inductor 118 may be coupled between terminal T4 and terminal T5. JJ 124 may be coupled between terminal T5 and ground. In this example, when an SFQ pulse is driven into the input A, it will trigger junction 120 and a current will be stored in the loop formed by JJ 120, inductor 112, and JJ 122. Because inductor 112 is configured as a large inductive element, the stored current is small relative to the critical current of JJ 120. Thus, in this example, there is no bias condition under which the stored current in the loop will ever be able to trigger JJ 120 in the opposite direction and escape the storage loop via the input A. However, in this example, JJ 122 is configured such that the critical current of JJ 122 is much lower. Additionally, JJ 120 is over-biased. Thus, when the AC bias provides sufficient bias current to JJ 120, the combination of the stored current and the bias current will trigger junction JJ 120. This will remove the current from the storage loop and allow the SFQ pulse to propagate to the output O, (in this example, JJ 124 is being biased by the same AC bias and will thus JJ 124 will trigger and propagate the pulse immediately). In general, in this example, the product of the critical current in milliamperes (mA) times the inductor value in pico-Henry (pH) may be approximately $\phi 0/3$, where $\phi 0$ is the magnetic flux quanta, which may be approximately 2.07 mA/pH. Thus, based on this relationship as the Josephson junction gets smaller, the inductor gets larger. In one example, JJ 120 may be biased (e.g., the sum of DC bias and AC bias at the peak of a clock signal such as an alternating current (AC) clock signal) to less than 45 percent of its critical current. In one example, JJ 120 may be much larger than JJ 122. In one example, in terms of its critical current, JJ 120 may have critical current 1.1 to 1.4 times larger than JJ 122. Additionally, inductors 110 and 112 may be sized differently. Inductor 110 may be sized to be approximately 10-30% smaller than it would be based on the critical current of the large JJ 120. In addition, in this example, conversely inductor 112 may be sized to be approximately 60-80% larger than it would be based upon the critical current of JJ 122. Although FIG. 1 shows a certain number of components of UPMB 100 arranged in a certain manner, there could be more or fewer number of components arranged differently.

In comparison with the case of a standard JTL, in case of UPMB 100 the entry of an SFQ pulse by triggering of JJ 120 to enter the storage loop is entirely dependent upon the signal from the input. An SFQ pulse may trigger JJ 120 and enter the storage loop any time a driving JTL (coupled to the input A) has sufficient bias to drive the input. At the same time, in this example, exiting the storage loop is entirely dependent upon the bias level of JJ 122. By combining this effect with the large inductances that minimize current leakage, the relative AC phase difference between UPMB 100 and the JTL driving its input may be any value, as compared to a JTL that generally cannot operate with more than 90 degrees of phase difference. If the phase difference between the driving JTL and UPMB 100 is greater than 90 degrees, then there is the potential for the driving JTL to drive a second reciprocal pulse into the input prior to the first pulse being able to exit through the output. This, however, in this example is not an issue because in phase mode logic, two pulses that are close enough together to annihilate in the storage loop of the unidirectional JTL represent a glitch, the intermediate value is unimportant, and the annihilation has no effect on the operation of the circuit.

UPMB 100 may be used as part of a PML device, such as a decoder, a counter, a programmable logic array (PLA), a processor, a memory, or any other PML device that may include a JTL. Unidirectional phase mode buffer 100 may be powered by alternating current (AC) and may be used to propagate both positive and negative SFQ pulses. DC bias may also be supplied to the buffer. In one example, DC bias may be provided using a charge pump that may supply a DC bias current. In this example, AC bias may be provided via a sinusoidal clock signal. In phase-mode logic, digital values may be encoded as Josephson junction (JJ) phase. A high phase may indicate a logic '1' and a low phase may indicate a logic '0.' Unlike the traditional reciprocal quantum logic (RQL) encoding, these values are persistent across RQL clock cycles because there is no requirement for a reciprocal pulse to reset the JJ phase. As an example, if an AC clock signal, with four phases, were used to power the phase-mode logic circuit, the output of the phase-mode logic circuit may be persistent across all four phases of the AC clock signal. The AC clock signal may be a sinusoidal clock signal that may provide AC power to the superconducting logic circuits that comprise the phase-mode logic devices. Two such clocks can provide a four-phase clock. In one example, cross-wired transformers may be used to produce a four-phase clock from two AC clock signals. For example, by coupling the clock lines to the Josephson junctions in the gates of a respective superconducting circuit in a wound or counter-wound fashion, four phases of clock may be derived. The four phases of the clock may provide directionality to the single flux quantum (SFQ) pulses. Thus, as an example, with respect to a four-phase clock, the positive pulse may ride the leading edge of the clock from one phase to the next and arrive at the output after one cycle of delay and the negative pulse may follow with half a cycle of separation.

Phase-mode logic may use modified versions of superconducting logic gates, e.g., reciprocal quantum logic (RQL) gates. Some of these gates may be used as part of general combinational logic built using these gates, while others may only be used within state elements. Combinational logic using phase-mode logic may be designed using gates, such as AND/OR gates, that provide the basic Boolean functions. A phase-mode logic inverter may implement an inverter by transforming a positive SFQ pulse into a negative SFQ pulse and by transforming a negative SFQ pulse into a positive SFQ pulse. In one example, the phase-mode logic inverter may include a flip gate, an inverter, an inductor, and another inductor for coupling a flux bias to phase-mode logic inverter. Transitioning through a phase-mode logic inverter may move the pulse from its current phase domain to another phase domain that is 180 degrees out of phase. Thus, for example, a positive pulse (e.g., in 0+ degree phase domain) inverts to a negative pulse (e.g., in −180 degrees phase domain) in the second half of the preceding 180 degrees phase domain. Similarly, a negative pulse (e.g., in 0+ degree phase domain) inverts to a positive pulse (e.g., in +180 degrees phase domain) in the first half of the subsequent 180 degrees phase domain. The inversion itself may cause minimal time delay, but it may cause a 180 degree phase shift. This phase shift may necessitate two phase boundaries to realign inverted and non-inverted signals for arrival into a gate with two inputs. If an inversion can be generated early, then the required two phase offset may already exist in the circuit. If not, then additional phase boundaries may need to be added. At the phase boundary—where junctions may be coupled to a clock line with a different phase—early pulses may need to wait until the rise of the clock signal in the next phase. In one example, UPMB 100 may be used to hold the input without the need for adding JTLs or other such components.

Figure 2:
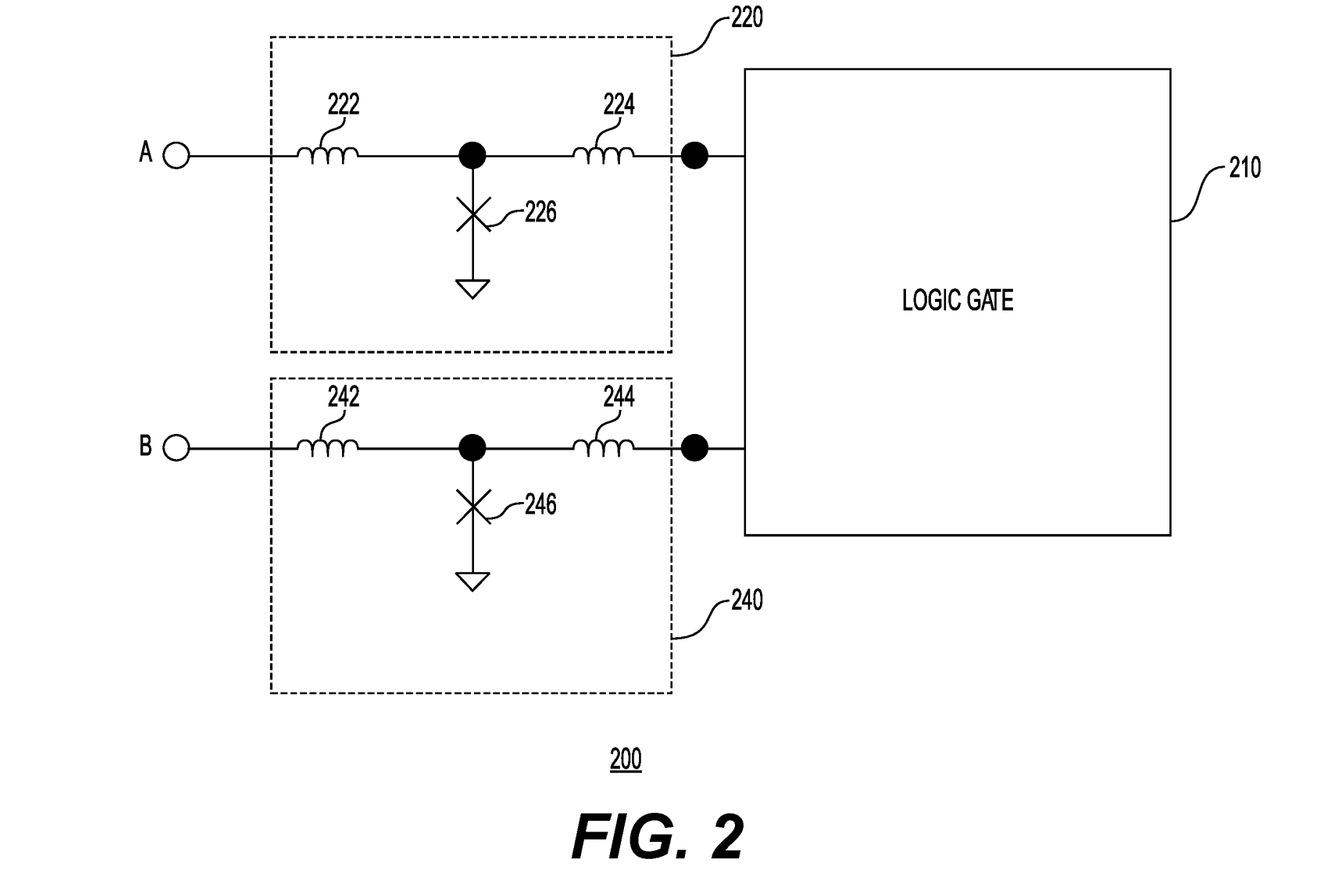
FIG. 2 shows a diagram of a unidirectional phase mode buffer integrated with a logic gate in accordance with one example.

FIG. 2 shows a diagram 200 of unidirectional phase mode buffers (220 and 240) integrated with a logic gate 210 in accordance with one example. Logic gate 210 may include Josephson junctions and may have a first input terminal for receiving quantum signals and a second input terminal for receiving quantum signals. The quantum signals may be quantum pulses, including SFQ pulses. Unidirectional phase mode buffers may be integrated with logic gate 210 to provide enforced directionality with respect to quantum signals. In this example, these buffers may allow quantum pulses, such as SFQ pulses to, propagate from left to right but not from right to left. As shown in FIG. 2, this may be accomplished by having a unidirectional phase mode buffer 220 having an input terminal (terminal A) for receiving quantum signals and an output terminal for coupling the quantum signals to one of the input terminals of logic gate 210, where unidirectional phase mode buffer 220 is configured to propagate quantum signals in only a first direction (e.g., left to right). Similarly, this may be accomplished by having a unidirectional phase mode buffer 240 having an input terminal (terminal B) for receiving quantum signals and an output terminal for coupling the quantum signals to one of the input terminals of logic gate 210, where unidirectional phase mode buffer 240 is configured to propagate quantum signals in only a first direction (e.g., left to right). In this example, unidirectional phase mode buffer 220 may include an inductor 222 with one of its terminal coupled to input terminal A and the other terminal coupled to a Josephson junction (JJ) 226 and to one of the terminals of an inductor 224. JJ 226 may further be coupled to ground as shown in FIG. 2. The other terminal of inductor 224 may be coupled to one of the input terminals of logic gate 210. In this example, unidirectional phase mode buffer 240 may include an inductor 242 with one of its terminal coupled to input terminal B and the other terminal coupled to a Josephson junction (JJ) 246 and to one of the terminals of an inductor 244. JJ 246 may further be coupled to ground as shown in FIG. 2. The other terminal of inductor 244 may be coupled to one of the input terminals of logic gate 210. As discussed earlier, the relative sizing of the inductors and the relative biasing of the Josephson junctions, including JJs 226 and 246, may be such that SFQ pulses may only travel from left to right and may never travel right to left. Although FIG. 2 shows a certain number of components of UPMBs 220 and 240 arranged in a certain manner, there could be more or fewer number of components arranged differently. In addition, the integration of the UPMBs with logic gate 210 may require additional elements, such as AC/DC bias coupling inductors or windings and other components.

Figure 3:
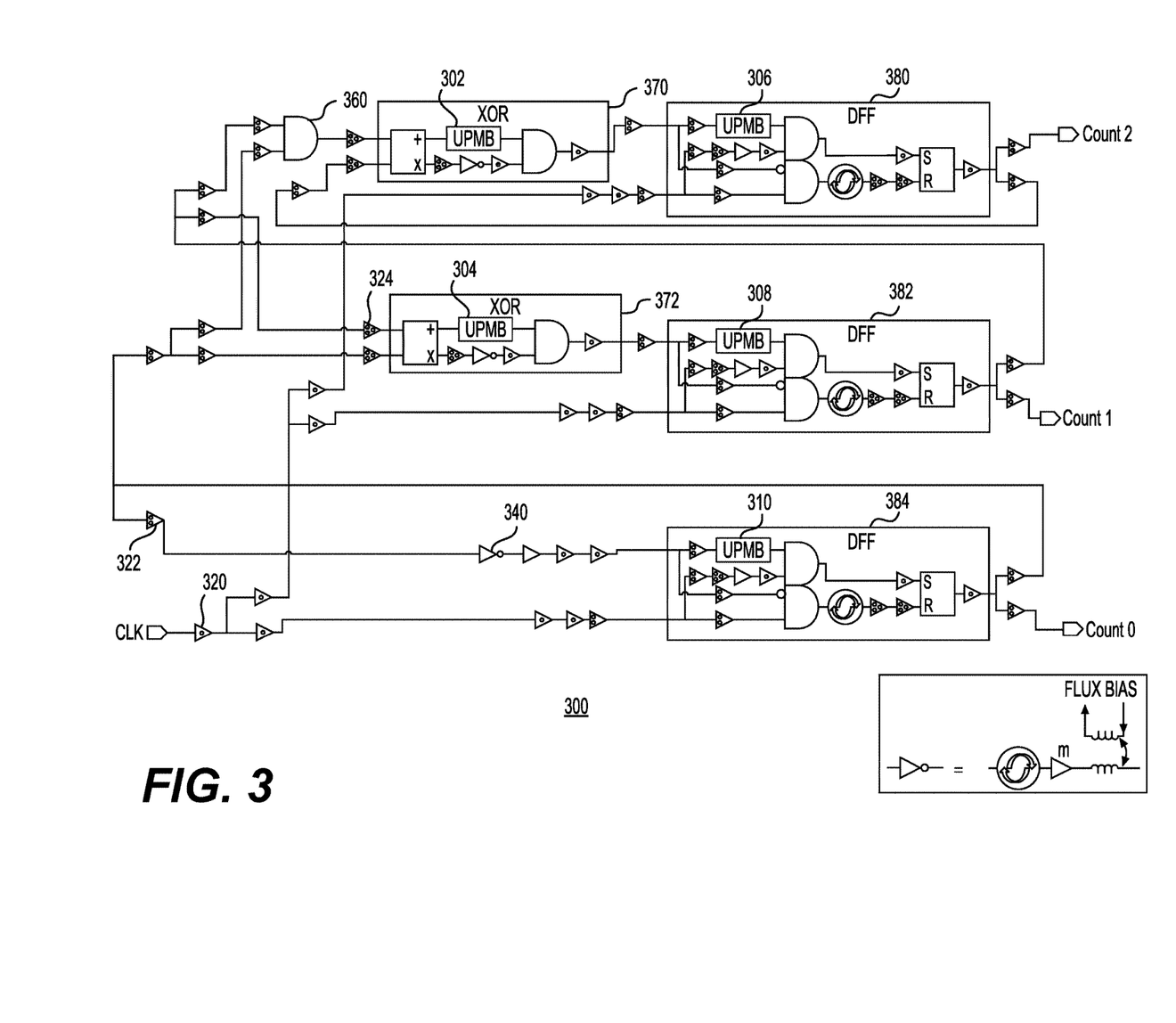
FIG. 3 shows a diagram of a three-bit counter that includes a unidirectional phase mode buffer and other phase-mode logic circuits in accordance with one example.

FIG. 3 shows a diagram of a three-bit counter 300 that includes a unidirectional phase mode buffer and other phase-mode logic circuits in accordance with one example. In one example, three-bit counter 200 may include several unidirectional phase mode buffers (UPMBs, e.g., UPMB 100)

such as UPMB 302, UPMB 304, UPMB 306, UPMB 208, and UPMB 310 as shown in FIG. 3. Three-bit counter 300 may further include several Josephson transmission lines (JTLs), including for example JTL 320, JTL 322, and JTL 324. The dots shown as part of JTLs represent 90 degrees of phase; thus, for example, no dot represents 0 degrees, one dot represents 90 degrees, two dots represent 180 degrees, and three dots represent 270 degrees. Three-bit counter 300 may further include several logic circuits, including an AND gate 360, an exclusive OR (XOR) circuit 370, another XOR circuit 372, a D flip-flop (DFF) 380, a second D flip-flop (DFF) 382, a third D flip-flop (DFF) 384, and a phase-mode logic inverter 340, and multiple JTLs. As shown in the right-hand bottom corner of FIG. 3, in one example, phase-mode logic inverter 340 may include a flip-gate, a JTL, and a DC flux bias element coupled as shown. In operation, a positive pulse received at the input (IN) may propagate through flip gate. The output of flip gate may be a negative pulse (inverted by flip gate). The negative pulse may then be processed by the JTL, which may apply a gain to the pulse. DC flux bias element may receive the processed negative pulse and it may add a full quantum of flux to the processed negative pulse resulting in an integral of the voltage of the processed negative pulse that is shifted in terms of phase. In a phase mode logic circuit with four phase clocks, inversions may necessitate a 180 degree phase shift. This happens because, in this example, RQL-based Josephson transmission lines (JTLs) can only pass either a positive or a negative pulse in any given phase, but not both. D flip-flop 380 may produce the Count 2 output. D flip-flop 382 may produce the Count 1 output. D flip-flop 384 may produce the Count 0 output. Each clock pulse pair may make three-bit counter 300 advance. With the JTLs, additional delay may be added to the input of the D flip-flops to ensure that the input to each of the D flip-flops is not sampled before it is stable. For example, as shown in FIG. 3, the clock received at the input D of each of the D flip-flops may be delayed in relation to the clock signal (labeled as CLK). No minimum clock rate is required, as the clock pulses may be sent as slowly as desired. Each clock pulse pair may make the counter advance. According to one example, three-bit counter 300 may run as fast as half the AC clock frequency. In the example three-bit counter 300, JTLs are used for phase alignment, which may occur when two logic cones of different depths converge and the phase depth of each is unequal. Three-bit counter 300 may operate by relying upon multi-phase clock signals, for example a four phase clock signal. Phase mode logic helps by removing the need to ensure that all inputs arrive at the logic gates in the same AC clock cycle. Standard RQL JTLs do not support phase advances of larger than 90 degrees. Thus, up to three JTLs may be used every time logic cones converge to align inputs to the same AC clock phase, which in this example may occur at the inputs of every multi-input logic gate, such as D flip-flops, AND gates, and XOR logic circuits in FIG. 3. The unidirectional phase mode buffer may advantageously remove the need for such JTLs by reducing the maximum number of JTLs required in such circuits from three to one. As an example, UPMB 306 may be used to replace three JTLs in D flip-flop 380; UPMB 308 may also be used to replace three JTLs in D flip-flop 382; and UPMB 310 may also be used to replace three JTLs in D flip-flop 384. This may advantageously reduce the size of such PML based devices and circuits. Although FIG. 3 shows a certain number of components of three-bit counter 300 arranged in a certain manner, there could be more or fewer number of components arranged differently.

Figure 4:
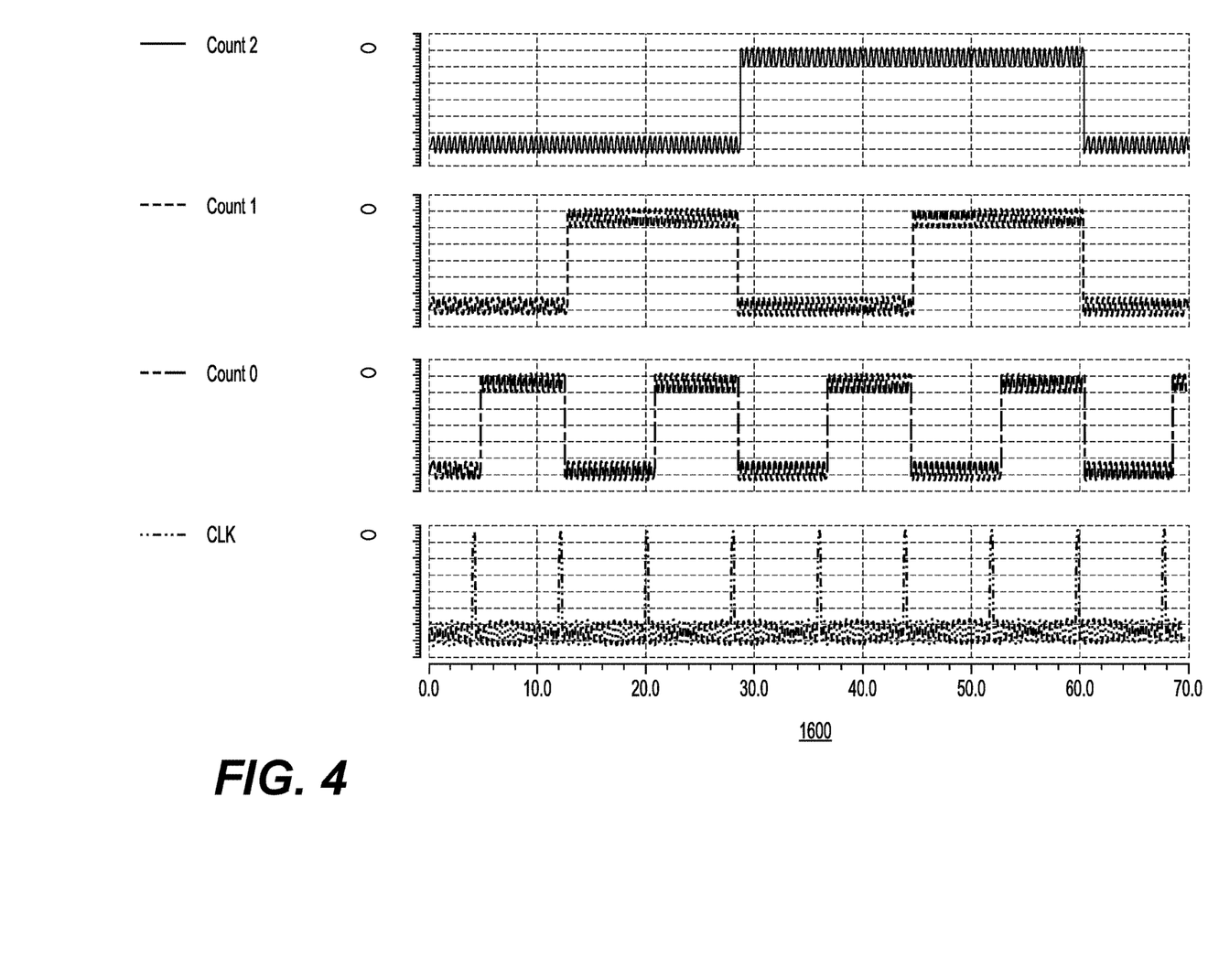
FIG. 4 shows the output waveforms of the three-bit counter of FIG. 3 in accordance with another example.

FIG. 4 shows the output waveforms of the three-bit counter 300 in accordance with another example. In this example, three-bit counter 200 may run based on a clock (e.g., CLK) rate. Each tick of the clock (e.g., CLK) may release one set of pulses from the outputs of each of the D flip-flops once it reaches a particular D flip-flop. Each of these pulses may filter through the circuit and arrive at the AND gate attached to the D input of the respective flip-flop. The results may wait here until the next clock pulse arrives to capture this value and release it back into the combinational system. Thus, for example, the first clock pulse may release an output pulse at the Count 0 output. A subsequent clock pulse may release an output pulse at the Count 1 output. Yet another subsequent clock pulse may release an output pulse at the Count 2 output.

In conclusion, in one example, the present disclosure relates to a device including a first Josephson junction transmission line (JTL) for propagating a first set of quantum signals in a first direction and a second Josephson junction transmission line (JTL) for propagating a second set of quantum signals in the first direction. The device may further include a logic gate comprising a plurality of Josephson junctions, where the logic gate has a first input terminal for receiving the first set of quantum signals via the first JTL, and a second input terminal. The device may further include at least one unidirectional buffer having a first input terminal for receiving the second set of quantum signals via the second JTL and an output terminal for coupling the second set of quantum signals to the second input terminal of the at least one logic gate, where the unidirectional buffer may be configured to propagate quantum signals in only the first direction.

The unidirectional buffer may include a first inductive element coupled between a first terminal and a second terminal, a first Josephson junction coupled between the second terminal and a ground terminal, a second inductive element coupled between the second terminal and a third terminal, and a second Josephson junction coupled between the third terminal and the ground terminal, wherein the second inductive element is configured to form an inductive loop comprising the first Josephson junction, the second inductive element, and the second Josephson junction. The first Josephson junction may have a corresponding first critical current value and the second Josephson junction may have a corresponding second critical current value, and the first critical current value is approximately 1.1 to 1.4 times the second critical current value. The inductive loop may be configured to store a current in the inductive loop. The unidirectional buffer may be configured to receive power via a clock signal comprising a plurality of phases, and where the clock signal is configured to provide a bias current to at least the second Josephson junction. The unidirectional buffer may be configured to propagate a quantum signal in the first direction when a sum of the bias current and the current stored by the inductive loop is sufficient to trigger the second Josephson junction. The quantum signals may comprise single-flux quantum (SFQ) pulses and the SFQ pulses may comprise positive SFQ pulses and negative SFQ pulses.

In another aspect, the present disclosure relates to a unidirectional buffer including an input terminal for receiving quantum signals via a Josephson transmission line (JTL) configured to propagate signals in a first direction, where the unidirectional buffer is configured to propagate quantum signals in only the first direction and not in a second direction opposite to the first direction. The unidirectional buffer may include a first inductive element coupled between a first terminal and a second terminal, a first Josephson junction coupled between the second terminal and a ground terminal, a second inductive element coupled between the second terminal and a third terminal, and a second Josephson junction coupled between the third terminal and the ground terminal, wherein the second inductive element is configured to form an inductive loop comprising the first Josephson junction, the second inductive element, and the second Josephson junction. The first Josephson junction may have a corresponding first critical current value and the second Josephson junction may have a corresponding second critical current value, and the first critical current value is approximately 1.1 to 1.4 times the second critical current value. The inductive loop may be configured to store a current in the inductive loop. The unidirectional buffer may be configured to receive power via a clock signal comprising a plurality of phases, and where the clock signal is configured to provide a bias current to at least the second Josephson junction. The unidirectional buffer may be configured to propagate a quantum signal in the first direction when a sum of the bias current and the current stored by the inductive loop is sufficient to trigger the second Josephson junction. The quantum signals may comprise single-flux quantum (SFQ) pulses and the SFQ pulses may comprise positive SFQ pulses and negative SFQ pulses.

In another aspect, the present disclosure relates to a device including a logic gate comprising a plurality of Josephson junctions, where the logic gate has a first input terminal for receiving quantum signals and a second input terminal for receiving quantum signals. The device may further include a first unidirectional buffer having a first input terminal for receiving the quantum signals and an output terminal for coupling the quantum signals to the first input terminal of the at least one logic gate, where the unidirectional buffer is configured to propagate quantum signals in only the first direction. The device may further include a second unidirectional buffer having a first input terminal for receiving the quantum signals and an output terminal for coupling the quantum signals to the first input terminal of the at least one logic gate, where the unidirectional buffer is configured to propagate quantum signals in only the first direction.

The first unidirectional buffer may comprise a first inductive loop and the second unidirectional buffer may comprise a second inductive loop, and where each of the first inductive loop and the second inductive loop may be configured to store a current. Each of the first unidirectional buffer and the second unidirectional buffer may be configured to propagate the quantum signals in only the first direction when a sum of any stored current in a corresponding inductive loop and any bias current received via a clock signal exceeds a threshold. The quantum signals may comprise single-flux quantum (SFQ) pulses and the SFQ pulses may comprise positive SFQ pulses and negative SFQ pulses It is to be understood that the methods, modules, and components depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A device comprising:
a first Josephson junction transmission line (JTL) for propagating a first set of quantum signals in a first direction;
a second Josephson junction transmission line (JTL) for propagating a second set of quantum signals in the first direction;
a logic gate comprising a plurality of Josephson junctions, wherein the logic gate having a first input terminal for receiving the first set of quantum signals via the first JTL, and a second input terminal; and
at least one unidirectional buffer having a first input terminal for receiving the second set of quantum signals via the second JTL and an output terminal for coupling the second set of quantum signals to the second input terminal of the at least one logic gate, wherein the unidirectional buffer is configured to propagate quantum signals in only the first direction.

2. The device of claim 1, wherein the unidirectional buffer comprising:
a first inductive element coupled between a first terminal and a second terminal;
a first Josephson junction coupled between the second terminal and a ground terminal;
a second inductive element coupled between the second terminal and a third terminal; and
a second Josephson junction coupled between the third terminal and the ground terminal, wherein the second inductive element is configured to form an inductive loop comprising the first Josephson junction, the second inductive element, and the second Josephson junction.

3. The device of claim 2, wherein the inductive loop is configured to store a current in the inductive loop.

4. The device of claim 3, wherein the unidirectional buffer is configured to receive power via a clock signal comprising a plurality of phases, and wherein the clock signal is configured to provide a bias current to at least the second Josephson junction.

5. The device of claim 4, wherein the unidirectional buffer is configured to propagate a quantum signal in the first direction when a sum of the bias current and the current stored by the inductive loop is sufficient to trigger the second Josephson junction.

6. The device of claim 1, wherein each of the first set of quantum signals and the second set of quantum signals comprises single-flux quantum (SFQ) pulses.

7. The device of claim 6, wherein the SFQ pulses comprise positive SFQ pulses and negative SFQ pulses.

8. A device comprising:
a first Josephson junction transmission line (JTL) for propagating a first set of quantum signals in a first direction;
a second Josephson junction transmission line (JTL) for propagating a second set of quantum signals in the first direction;
a logic gate comprising a plurality of Josephson junctions, wherein the logic gate having a first input terminal for receiving the first set of quantum signals via the first JTL, and a second input terminal; and
at least one unidirectional buffer having a first input terminal for receiving the second set of quantum signals via the second JTL and an output terminal for coupling the second set of quantum signals to the second input terminal of the at least one logic gate, wherein the unidirectional buffer is configured to propagate quantum signals in only the first direction, wherein the at least one unidirectional buffer comprising:
a first inductive element coupled between a first terminal and a second terminal;
a first Josephson junction coupled between the second terminal and a ground terminal;
a second inductive element coupled between the second terminal and a third terminal; and
a second Josephson junction coupled between the third terminal and the ground terminal, wherein the second inductive element is configured to form an inductive loop comprising the first Josephson junction, the second inductive element, and the second Josephson junction, wherein the first Josephson junction has a corresponding first critical current value and the second Josephson junction has a corresponding second critical current value, and wherein the first critical current value is approximately 1.1 to 1.4 times the second critical current value.

9. The device of claim 8, wherein the inductive loop is configured to store a current in the inductive loop.

10. The device of claim 8, wherein the unidirectional buffer is configured to receive power via a clock signal comprising a plurality of phases, and wherein the clock signal is configured to provide a bias current to at least the second Josephson junction.

11. The device of claim 10, wherein the unidirectional buffer is configured to propagate a quantum signal in the first direction when a sum of the bias current and the current stored by the inductive loop is sufficient to trigger the second Josephson junction.

12. The device of claim 8, wherein each of the first set of quantum signals and the second set of quantum signals comprises single-flux quantum (SFQ) pulses.

13. The device of claim 12, wherein the SFQ pulses comprise positive SFQ pulses and negative SFQ pulses.

14. A unidirectional buffer comprising:
an input terminal for receiving quantum signals via a Josephson transmission line (JTL) configured to propagate signals in a first direction, wherein the unidirectional buffer is configured to propagate quantum signals in only the first direction and not in a second direction opposite to the first direction;
a first inductive element coupled between the input terminal and a second terminal;
a first Josephson junction coupled between the second terminal and a ground terminal
a second inductive element coupled between the second terminal and a third terminal; and
a second Josephson junction coupled between the third terminal and the ground terminal, wherein the second inductive element is configured to form an inductive loop comprising the first Josephson junction, the second inductive element, and the second Josephson junction, wherein the inductive loop is configured to store a current in the inductive loop, and wherein the unidirectional buffer is further configured to receive power via a clock signal comprising a plurality of phases, and wherein the clock signal is configured to provide a bias current to at least the second Josephson junction.

15. The unidirectional buffer of claim 14, wherein the unidirectional buffer is further configured to propagate a quantum signal in the first direction when a sum of the bias current and the current stored by the inductive loop is sufficient to trigger the second Josephson junction.

16. The unidirectional buffer of claim 14, wherein the quantum signals comprise single-flux quantum (SFQ) pulses.

17. The unidirectional buffer of claim 16, wherein the SFQ pulses comprise positive SFQ pulses and negative SFQ pulses.

18. The unidirectional buffer of claim 14, wherein the first Josephson junction has a corresponding first critical current value and the second Josephson junction has a corresponding second critical current value, and wherein the first critical current value is approximately 1.1 to 1.4 times the second critical current value.

* * * * *